(12) United States Patent
Bergman et al.

(10) Patent No.: US 11,673,830 B2
(45) Date of Patent: Jun. 13, 2023

(54) GLASS CARRIER CLEANING USING OZONE

(71) Applicant: APPLIED Materials, Inc., Santa Clara, CA (US)

(72) Inventors: Eric J. Bergman, Kalispell, MT (US); David P. Surdock, Kalispell, MT (US); Graeme Bell, Bigfork, MT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 157 days.

(21) Appl. No.: 17/095,417

(22) Filed: Nov. 11, 2020

(65) Prior Publication Data

US 2022/0144699 A1 May 12, 2022

(51) Int. Cl.
*C03C 23/00* (2006.01)
*H01L 21/673* (2006.01)

(52) U.S. Cl.
CPC ........ *C03C 23/0075* (2013.01); *H01L 21/673* (2013.01)

(58) Field of Classification Search
None
See application file for complete search history.

(56) References Cited

U.S. PATENT DOCUMENTS

| | | |
|---|---|---|
| 2001/0042555 A1 | 11/2001 | Bergman et al. |
| 2002/0050279 A1 | 5/2002 | Bergman |
| 2003/0205254 A1* | 11/2003 | Bergman ......... H01L 21/02052 |
| | | 257/E21.228 |
| 2007/0227556 A1 | 10/2007 | Bergman |
| 2007/0295366 A1 | 12/2007 | Tomita et al. |
| 2012/0160276 A1 | 6/2012 | Okorn-Schmidt et al. |
| 2015/0306847 A1 | 10/2015 | Bellman et al. |
| 2017/0036419 A1* | 2/2017 | Adib ................ B32B 37/26 |
| 2017/0271307 A1* | 9/2017 | Hiner ................ H01L 24/97 |
| 2018/0269077 A1* | 9/2018 | Zhang ............... H01L 21/6715 |
| 2019/0096708 A1 | 3/2019 | Sharma |

FOREIGN PATENT DOCUMENTS

| | | |
|---|---|---|
| JP | 2000126703 A | 5/2000 |
| JP | 2002151453 A | 5/2002 |

OTHER PUBLICATIONS

PCT, International Search Report and Written Opinion dated Jan. 7, 2022 for International Application No. PCT/US2021/051138, 11 pages.

* cited by examiner

*Primary Examiner* — Natasha N Campbell
*Assistant Examiner* — Pradhuman Parihar
(74) *Attorney, Agent, or Firm* — Perkins Coie LLP

(57) ABSTRACT

In a method for removing an organic adhesive from a glass carrier in a semiconductor manufacturing process, the glass carrier is placed into a process chamber. The glass carrier is rotated and heated sulfuric acid is applied or sprayed onto the glass carrier. Ozone is introduced into the process chamber. The ozone diffuses through the sulfuric acid to the organic adhesive on the surface of the glass carrier. The sulfuric acid and the ozone chemically react with the organic adhesive and remove it from the glass carrier.

11 Claims, 3 Drawing Sheets

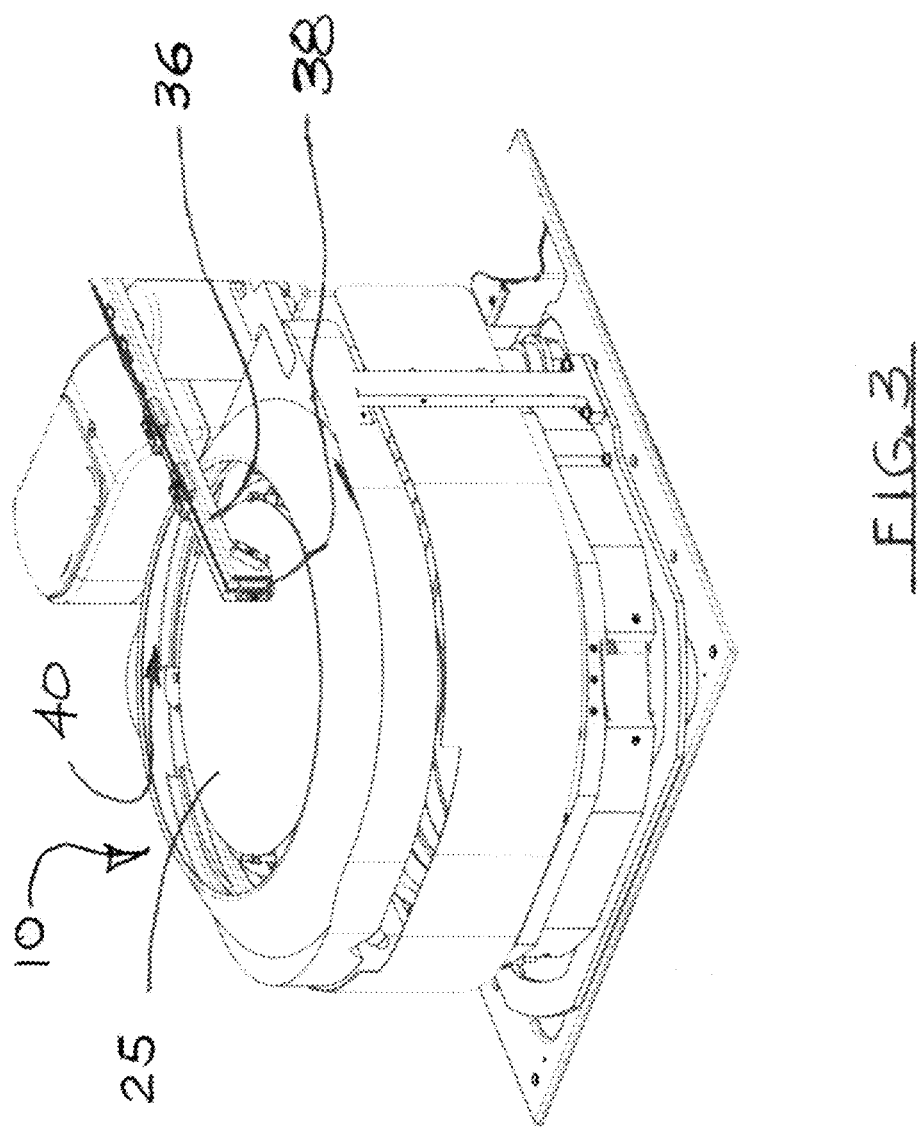

GLASS CARRIER CLEANING USING OZONE

BACKGROUND OF THE INVENTION

The field of the invention is removing organic adhesive films and residual metals from glass carriers used in semiconductor packaging.

In the manufacture of semiconductor devices, packaging and fan-out level processing has become more significant as manufacturing techniques have evolved. Packaging technology is no longer passive. It now plays an active role in device performance. In some packaging processes, it is necessary to adhere a thinned semiconductor wafer to a glass carrier, sometimes called a glass wafer. The glass carrier is a special glass component that is ultra-flat with a uniform surface quality, thickness, and high edge strength. The glass carrier supports the semiconductor wafer during additional processing, and is then separated from the semiconductor wafer or die after certain processing is completed. Glass carriers are often used if the semiconductor wafer has been thinned from its nominal 700 micron thickness. Glass carriers may also be used if the semiconductor wafer has been diced. Where the semiconductor wafer has been diced, the individual die or devices are separated from each other, or are connected only by a very thin section of the semiconductor wafer. With the diced semiconductor wafer adhered to a glass carrier, it may be further processed as if it was un-diced and still a monolithic semiconductor wafer.

Glass carriers are, of necessity, manufactured to very high quality standards and must meet critical specifications for parameters such as contamination and flatness. Thus they are a high cost element in the manufacturing process. The ability to reuse glass carriers reduces overall manufacturing costs and conserves resources. Reusing a glass carrier requires the glass carrier first be cleaned of contaminants, such as metals, mobile ions, particles and the organic adhesive film used to adhere the semiconductor wafer to the glass carrier. After cleaning, the glass must remain optically transparent to enable ultra-violet or infrared based debonding processes and laser mark serialization to be performed when the glass carrier is reused.

In the past, organic adhesive films have been removed from semiconductor wafers using chemistries such as sulfuric acid and hydrogen peroxide mixtures (SPM), also known as "piranha". This is typically a mixture of sulfuric acid (~96%) and hydrogen peroxide (~30%) by weight, and may be used at temperatures in the range of 50° C. to 130° C., with temperatures in the range of 90° C. to 120° C. being most common, using volumetric ratios in the range of 1:1 to 10:1. The combination of sulfuric acid and hydrogen peroxide will react to form very strong oxidizers:

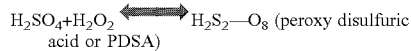
$H_2SO_4 + H_2O_2 \leftrightarrow H_2S_2-O_8$ (peroxy disulfuric acid or PDSA)

$H_2SO_4 + H_2O_2 \leftrightarrow H_2SO_5$ (Caro's acid)

These strong oxidizers are only produced in equilibrium in limited quantities and are relatively unstable and short-lived. However, they can be effective in removing organic films.

Although submicron size particles may be a factor in some manufacturing processes, for semiconductor device packaging specifications generally require cleanliness at ranges above 1 micron. Ammonium hydroxide (~30% $NH_3$ and hydrogen peroxide (~30%) mixtures (APM) have been used for particle removal from semiconductor wafers, as high pH chemistries are known to be effective for this purpose. Typical volumetric ratios of $H_2O:NH_4OH:H_2O_2$ are in the range of 5:1:1 to 50:1:1, with 20:4:1 being fairly common and operating temperatures in the range of 50° C. to 70° C.

Hydrogen peroxide is considered to be critical in cleaning silicon substrates in order to minimize silicon pitting in the presence of ammonia. Hydrogen peroxide helps to maintain a protective oxide film on the silicon. However, hydrogen peroxide is relatively unstable, especially at elevated temperatures, in the presence of many metal ions and in the presence of either acids or bases. It will decompose to form water while releasing molecular oxygen. The need to dose hydrogen peroxide into the cleaning chemistry or replace the cleaning chemistry can be a major cost factor. Due to the decomposition of hydrogen peroxide forming water, limited bath dosing can be performed due to dilution considerations.

Metals removal is often accomplished with various acid mixtures. These may include $HCl:H_2O_2:H_2O$, HCl, $HCl:HNO_3$ etc. The selection of the cleaning mixture is dependent on the metals to be removed. These may include Cu, Ni, Sn, Sn, Ag, Co, Au, etc.

Glass cleaning has been accomplished by delivering a sequence of cleaning chemistries to the glass carrier, or moving the glass carrier through a series of tanks where it is exposed to the cleaning chemistries, usually with a rinse in between each chemical step and concluding with a drying step such as spin drying, 2-propanol (IPA) assisted drying or N2/heated N2 drying. A typical organic adhesive removal sequence may be:

SPM>DI water rinse>metals removal chemistry>DI water rinse>particle removal using APM>rinse>dry This known process of glass cleaning however involves the disadvantages of using hydrogen peroxide, as discussed above. It may also require use of an acid mixture for removing metals, and/or use of ammonium hydroxide to remove particles, adding to the cost, complexity, time requirements and environmental impact of the process. Accordingly, there is a need for improved processes for cleaning glass carriers.

SUMMARY OF THE INVENTION

Ozone is used to effectively clean glass carriers, at lower cost and with less environmental impact relative to known glass carrier cleaning techniques. Chemical costs and disposal costs are reduced. The present ozone processes may avoid using hydrogen peroxide, thereby extending bath life and reducing cost. The present ozone processes are capable of removing metal residues without the need of additional cleaning steps.

In one aspect, in a semiconductor manufacturing process, a semiconductor wafer is adhered or bonded temporarily to a glass carrier with an adhesive. The adhered semiconductor wafer is processed in one or more subsequent processing steps. The adhered semiconductor wafer is then removed from the glass carrier for further separate processing and/or packaging. The glass carrier is cleaned for reuse by placing the glass carrier into a process chamber. Sulfuric acid is applied to the surface of the glass carrier previously bonded to the semiconductor wafer. Ozone gas is provided into the process chamber. The ozone diffuses through the sulfuric acid to the surface. The sulfuric acid and the ozone remove the adhesive from the surface of the glass carrier. The glass carrier may be rotated at e.g., 100 to 2000 rpm. The sulfuric acid may be heated to e.g., 70 to 130° C. and sprayed onto the glass carrier.

Other advantages will become apparent to those skilled in the art from the following detailed description.

BRIEF DESCRIPTION OF THE DRAWINGS

In the drawings the same element number indicates the same element in each of the views.

DETAILED DESCRIPTION

A semiconductor material wafer is adhered to a glass carrier. The semiconductor wafer may be a thinned (i.e. to less than 700 microns thickness and typically 10 to 150 microns) or diced semiconductor wafer. An organic adhesive may be used to temporarily attach it to the glass carrier. Generally, the semiconductor wafer and the glass carrier are round. The diameter of the glass carrier may be the same as the semiconductor wafer or e.g., 1-4 mm greater than the nominal 300 mm diameter of the semiconductor wafer, or as set by industry standards such as SEMI 3D2. The semiconductor wafer bonded to the glass carrier is then processed in subsequent steps. During this subsequent processing, the organic adhesive may be converted or ashed due to exposure to laser light or other action. The semiconductor wafer must then be removed from the glass carrier and the glass carrier cleaned for reuse. The cleaning process may be performed as described below.

The adhesive is removed from a glass carrier using a (bulk) liquid mixture of sulfuric acid and ozone (SOM—sulfuric ozone liquid mixture). The SOM liquid mixture may be applied to the glass carrier at an elevated temperature, typically in the range of 70-130° C., 80-100° C., or 85-95° C. Specifically, the sulfuric acid may be heated before it is provided into the processing chamber. The glass carrier may also be preheated by heating the chamber, or via one or more heaters in the chamber. The glass substrate may also optionally be heated separately outside of the chamber and then moved into the chamber for processing. Sulfuric acid of standard concentration and purity as provided by the manufacturer for semiconductor applications may be used.

The solubility of ozone, like all gasses, decreases with increasing temperatures. However, the speed of chemical reactions increases with increasing temperatures. Thus, there is a balance to be achieved between maximizing ozone concentration and thermodynamic reaction rates as the rate will also be adversely impacted as ozone concentration decreases. While the most common means of applying SOM to a semiconductor wafer to be cleaned is to bubble or inject ozone into a tank of temperature controlled sulfuric acid, the ozone solubility limitation ordinarily would reduce the oxidizing effectiveness of the ozone. In the present process, the ozone solubility limitation may be reduced or overcome by injecting ozone gas directly into a process chamber containing the glass carrier(s) to be cleaned. In one embodiment, during the organic adhesive removal step, only sulfuric acid (as commercially supplied) and ozone are used, without any other chemistries.

Figure 1:
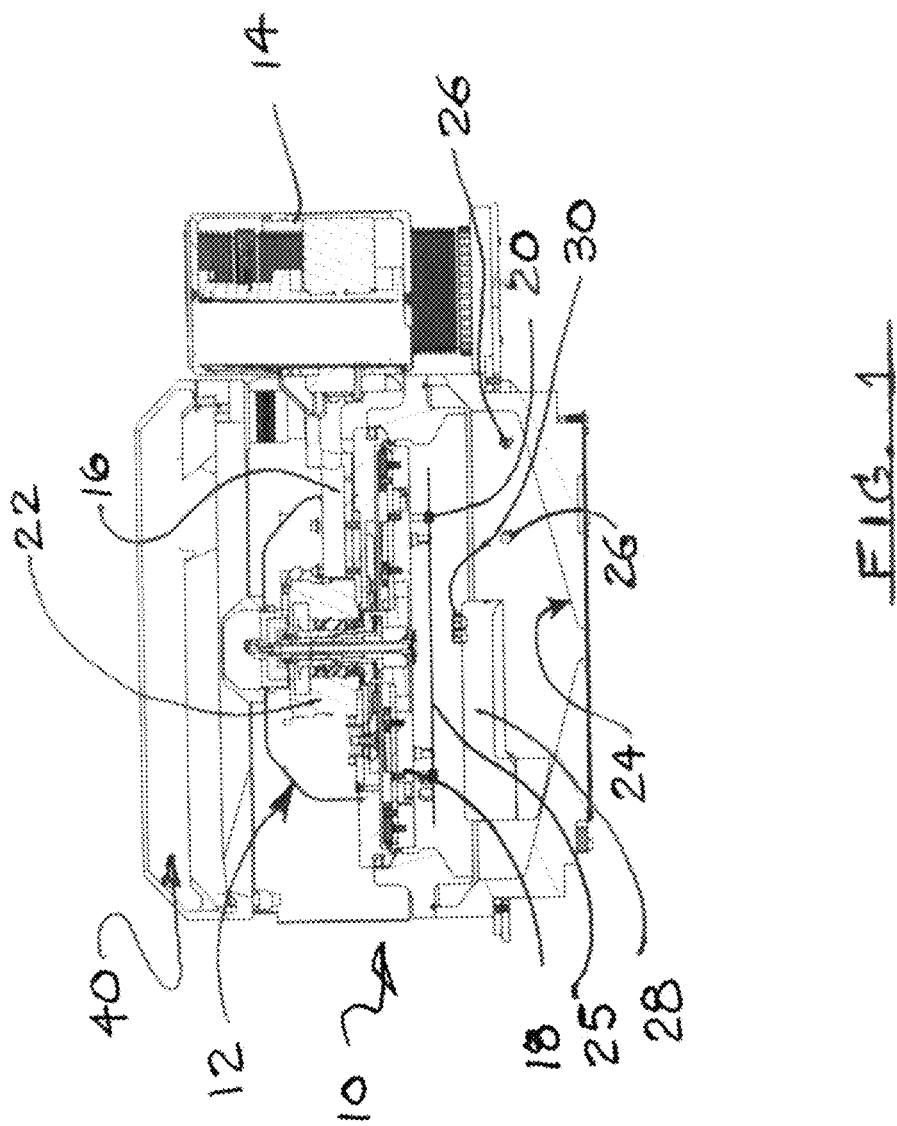
FIG. 1 is a schematic section view of a process chamber in a first position.
Figure 2:
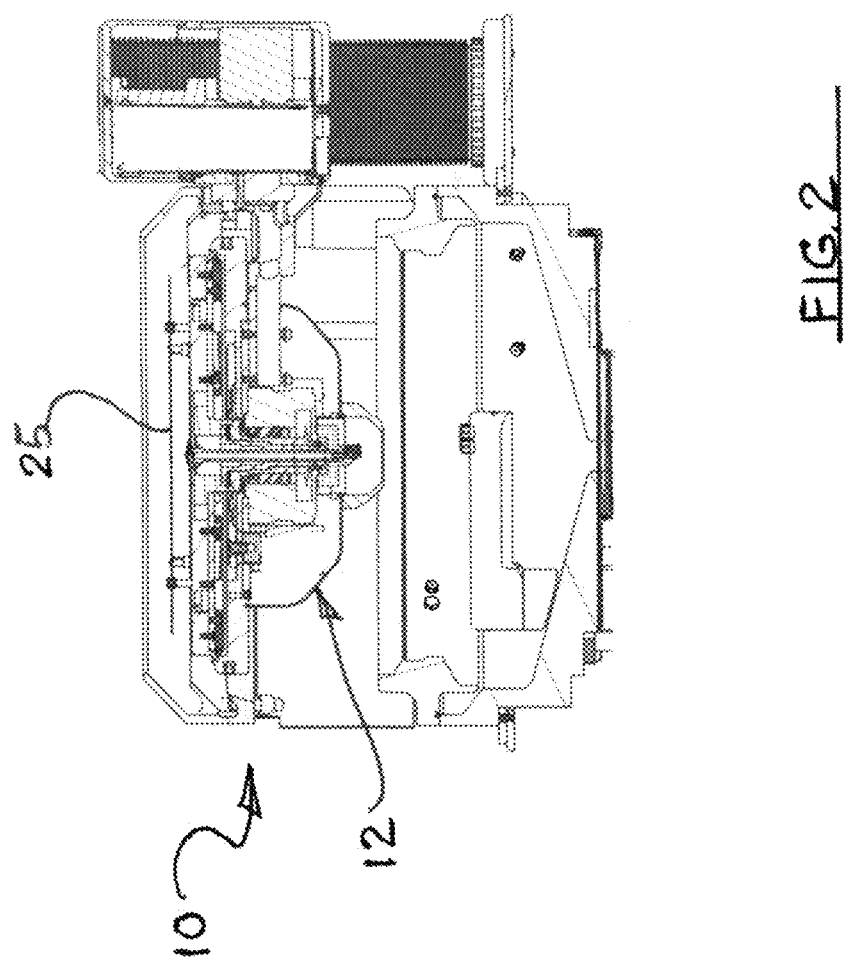
FIG. 2 is a schematic section view of the process chamber of FIG. 1 in a second position.
Figure 2:
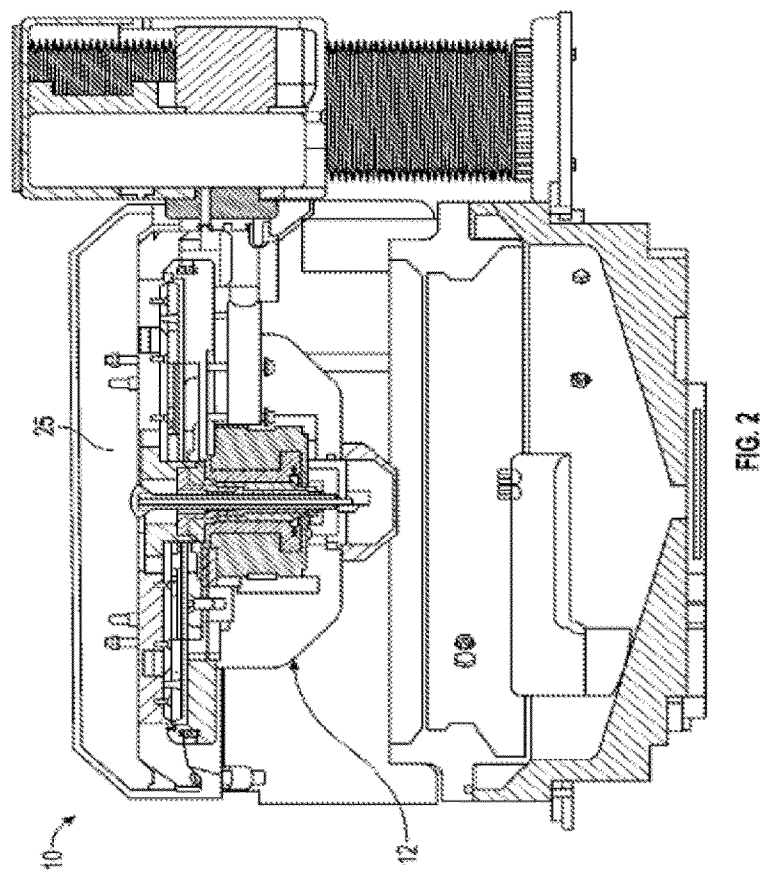
Figure 3:
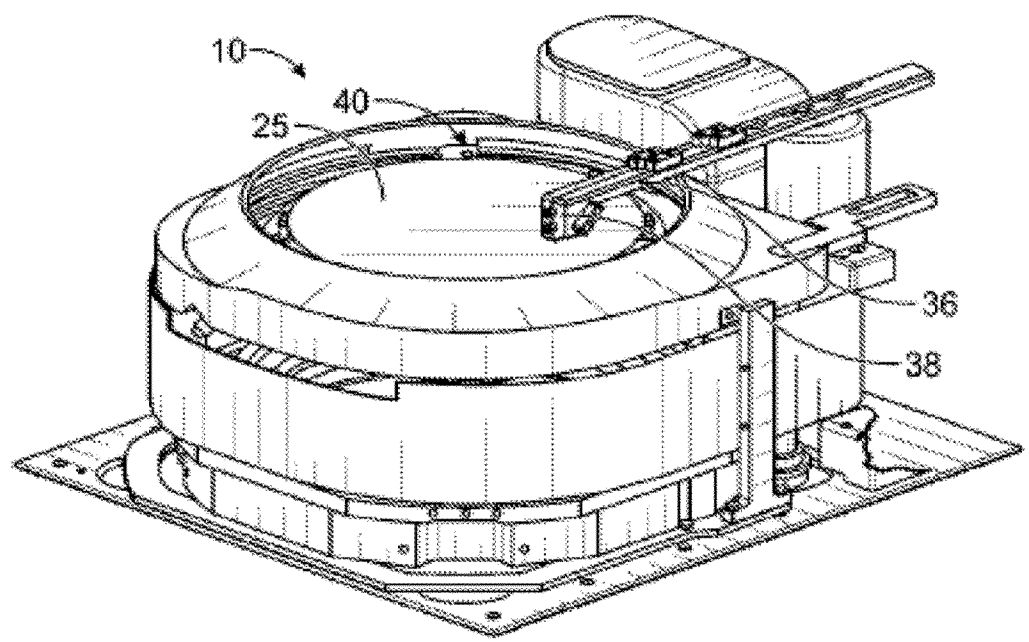
FIG. 3 is a perspective view of the process chamber of FIGS. 1 and 2 in the second position.

FIGS. 1-3 show a processor 10 which may be used to perform the present processes. A head 12 is supported on a head arm 16 of a lift/rotate mechanism 14. The lift/rotate mechanism may be designed and operate as described in U.S. Patent Application No. 20020053509 and No. 20060037855, incorporated herein by reference. A rotor 18 has fingers 20 for holding the edges of the glass carrier 25. A motor 22 in the head 12 rotates the rotor 18. The lift/rotate mechanism 14 can flip or rotate the head 12 from the face down or first position shown in FIG. 1 to the face up or second position shown in FIGS. 2 and 3. In the first position the glass carrier 25 is in a bowl or process chamber 24 of the processor 10. Nozzles or outlets 26 are positioned to introduce or spray ozone gas into the process chamber 24. The processor 10 may also include a process swing arm having one or more nozzles for spraying SOM onto the down-facing surface of the glass carrier 25. The processor 10 may be closed and sealed during processing, or only substantially closed, depending on the specific process and location of the process chamber. The fingers 20 may include a roller, ball or other engagement device which allows the glass carrier 25 to shift slightly during processing to better allow process liquids to contact all areas of the glass carrier 25.

Temperature controlled sulfuric acid may be sprayed onto the glass carrier 25 e.g., via nozzles 30 while ozone is simultaneously delivered into the process chamber 24 through outlets or nozzles 26. Alternatively, the glass carrier is exposed to an ozone containing environment while the glass carrier surface is coated with sulfuric acid.

The motor 22 is controlled to rotate the rotor 18 and the glass carrier 25 at 100 to 2000 rpm, 300 to 1500 rpm, or 300 to 1000 rpm. This rotation helps to distribute the sulfuric acid and thin the boundary layer of SOM liquid through which the ozone gas can diffuse to react with organic materials and metals on the glass carrier surface. This overcomes the constraint that temperature places on ozone at the glass carrier surface via solubility, as diffusion is a completely distinct mechanism from dissolution and is enhanced, rather than inhibited by increasing temperature.

Referring to FIGS. 2 and 3, the glass carrier 25 may be flipped over so that it is face up, and also lifted vertically up into the second position. The glass carrier 25, in the second position, may be rinsed with deionized water, and may be exposed to an ammonium hydroxide containing mixture delivered to up-facing surface of the glass carrier via the nozzle(s) 38 on the rinse arm 36. While ammonium hydroxide alone is a significant and suitable glass cleaning agent, the clean can be enhanced when coupled with an oxidizing agent in the form of hydrogen peroxide or ozone. In either case, the oxidizer can further remove any organic residues which may be present as well as some metals. The elevated pH enhances particle removal and leaves the glass in a fully cleaned state. After rinsing the glass carrier may be dried, optionally using rotation and/or heated air or gases. If the drain rings 40 are provided and used, the lift/rotate mechanism moves the rotor 18 vertically to collect liquid flung off the rotating glass carrier 25 into a selected drain ring.

Experiments have shown a significant and unexpected removal of various metals. Some of this removal may have been achieved by undercutting as the adhesive layer was removed. However, the cleaning was more efficient than expected or than was observed with typical SPM cleaning. Metal removal achieved and observed on test samples, especially when the SOM clean was used with an ammonium hydroxide based step, eliminated the need for a separate metals removal chemistry and cleaning step. Particle levels after removal of the adhesive film and metals were in the range of or lower than virgin glass provided from the manufacturer, per measurements made on a Tencor surface particle counter. Metals and mobile ion contamination levels were also acceptable for the purpose of reusing the glass carriers.

Samples which were cleaned through the above described process showed no degradation, cracking, crazing or imperfection that would render them unsuited for further use as glass carriers. There is no indication of the number of cleaning cycles generating an adverse impact on the glass quality.

As the ozone decomposes, it simply forms oxygen and therefore no bath dilution occurs. Thus, an SPM bath which might necessitate hydrogen peroxide dosing on an hourly basis and bath exchange every several hours can then be extended for at least a full day and potentially for multiple days.

The present methods allow for avoiding the use of hydrogen peroxide in the adhesive removal step. Bath life may therefore be extended. Bath dosing may also be avoided, which helps to avoid fluctuations in bath composition over time. The present methods also allow for effective removal of metals during the adhesive removal process without the need for a separate metals removal cleaning step. As a result of these factors, the present methods provide for improved and more cost effective cleaning of glass carriers.

Unlike known ozone processes used for cleaning semiconductor wafers, the present processes are need not achieve an extremely thin boundary layer of liquid on the glass carrier surface. For example, the liquid boundary layer of the SOM may be from 1-3 mm. If the glass carrier is rotated at a high rpm speed, the boundary layer of the SOM may be less than 1 mm in some applications, for example 0.1 to 1 mm or 0.1 to 5 mm. Unlike known ozone processes, the liquid is SOM, and not an aqueous solution. In addition, the organic adhesive on the glass carrier may be primarily lift off or peel-off process via the chemistry undercutting it, rather than entirely etching or oxidizing it away. The organic adhesive on the glass carriers is also different from those on semiconductor wafers because it is an ashed residue, after going through various process steps, This makes it more difficult to remove in comparison to the organic adhesive layers on semiconductor wafers. The residue and other contamination is also primarily around the edges of the glass carrier, whereas the edges of semiconductor wafers are generally free of any organic contaminant layer.

Generally, the glass carriers may be processed individually, with one glass carrier in the process chamber during each cleaning cycle. Alternatively, the process chamber may be designed to process multiple glass carriers in a batch. The glass carriers may typically be processed while in the horizontal position, either face-up or face-down, with gravity assisting in maintaining a uniform layer of the process liquid on the glass carrier. However, the glass carriers may also be processed in a non-horizontal position, or in a vertical position, depending on the design of the process chamber.

Thus, novel methods and apparatus have been shown and described. Various changes and substitutions may of course be made without departing from the spirit and scope of the invention. The invention, therefore, should not be limited, except by the following claims, and their equivalents.

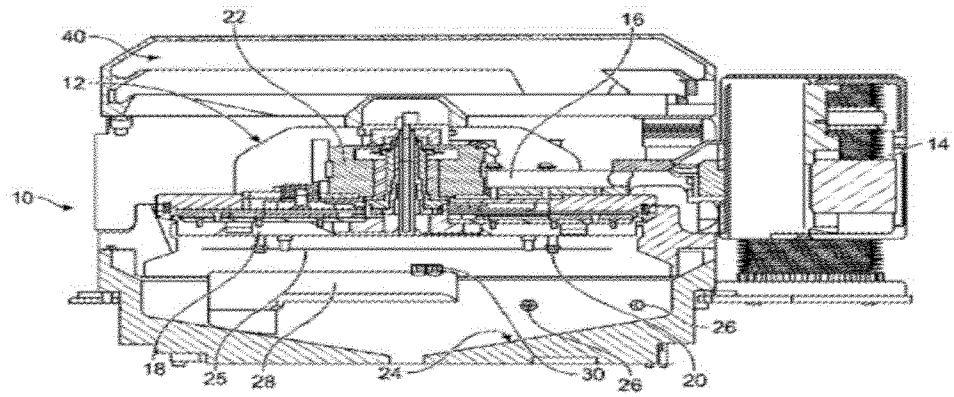

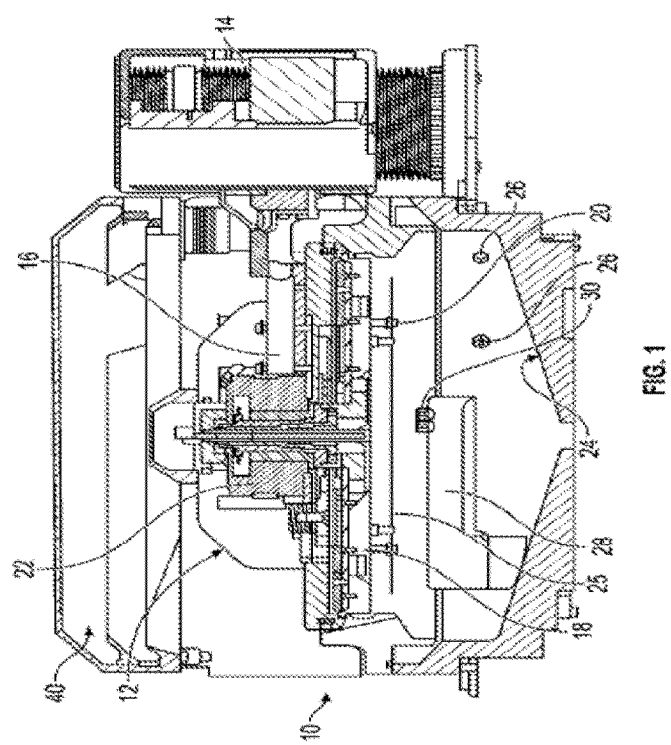

The invention claimed is:
1. A semiconductor manufacturing method, comprising:
 adhering a semiconductor wafer to a glass carrier with an organic adhesive;
 processing the adhered semiconductor wafer in one or more subsequent processing steps;
 removing the adhered semiconductor wafer from the glass carrier;
 placing the glass carrier onto a rotor in a process chamber with the glass carrier in a down-facing position, the rotor having a plurality of fingers holding the glass carrier on the rotor while allowing the glass carrier to move relative to the rotor;
 heating sulfuric acid to 70 to 130° C.;
 applying the heated sulfuric acid to a surface of the glass carrier;
 rotating the glass carrier at 100 to 2000 rpm and spraying the heated sulfuric acid onto the glass carrier, wherein the sulfuric acid forms a liquid boundary layer having a thickness of 1 to 3 mm; and
 providing ozone gas into the process chamber, the ozone diffusing through the sulfuric acid to the surface to remove the organic adhesive and metal contaminants from the surface of the glass carrier.

2. The method of claim 1, wherein the ozone is provided into the process chamber as a dry gas.

3. The method of claim 2, wherein the ozone diffuses through the sulfuric acid to the surface of the glass carrier, the sulfuric acid and the ozone chemically reacting with the organic adhesive to remove the organic adhesive from the glass carrier; and further including reusing the glass carrier by attaching a second semiconductor wafer to the glass carrier.

4. The method of claim 3, wherein the organic adhesive is ashed in the one or more subsequent processing steps.

5. The method of claim 3, wherein the organic adhesive is on a down-facing surface of the glass carrier and the sulfuric acid is sprayed at least partially vertically upward onto the down-facing surface.

6. The method of claim 5, further including flipping the glass carrier, applying hydrogen peroxide onto the glass carrier, rinsing the glass carrier with deionized water, and drying the glass carrier.

7. The method of claim 3, further including providing ammonium hydroxide onto the glass carrier in combination with hydrogen peroxide.

8. The method of claim 1, further including flipping the glass carrier over into a position wherein the surface is up-facing, applying hydrogen peroxide onto the surface, rinsing the surface with deionized water, and drying the glass carrier.

9. The method of claim 8, further including providing ammonium hydroxide onto the surface in combination with the hydrogen peroxide.

10. The method of claim 1, wherein no hydrogen peroxide is used.

11. A semiconductor manufacturing method, comprising:
 adhering a thinned and/or a diced semiconductor wafer to a glass carrier with an organic adhesive;
 processing the adhered thinned and/or a diced semiconductor wafer in one or more subsequent processing steps;
 removing the adhered thinned and/or a diced semiconductor wafer from the glass carrier;
 placing the glass carrier onto a rotor in a process chamber with the glass carrier in a down-facing position, the rotor having a plurality of fingers holding the glass carrier on the rotor while allowing the glass carrier to move relative to the rotor;
 heating sulfuric acid to 70 to 130° C.;

rotating the glass carrier at 100 to 2000 rpm and spraying the heated sulfuric acid onto a down-facing surface of the glass carrier, wherein the sulfuric acid forms a liquid boundary layer having a thickness of 1 to 3 mm;

providing ozone gas into the process chamber as a dry gas, the ozone diffusing through the sulfuric acid to the surface to remove organic adhesive and metal contaminants from the surface of the glass carrier;

flipping the glass carrier over into a position wherein the surface is up-facing, applying hydrogen peroxide and ammonium hydroxide onto the surface, rinsing the surface with deionized water, and drying the glass carrier; and reusing the glass carrier by adhering a second thinned and/or a diced semiconductor wafer to the glass carrier.

* * * * *

UNITED STATES PATENT AND TRADEMARK OFFICE
CERTIFICATE OF CORRECTION

PATENT NO. : 11,673,830 B2
APPLICATION NO. : 17/095417
DATED : June 13, 2023
INVENTOR(S) : Eric J. Bergman et al.

It is certified that error appears in the above-identified patent and that said Letters Patent is hereby corrected as shown below:

On the Title Page

Delete the title page and substitute therefore with the attached title page consisting of the corrected illustrative figure(s).

In the Drawings

On sheet 1 of 3, delete Figure 1 and insert the correct Figure 1 as shown on the attached drawing sheet.

On sheet 2 of 3, delete Figure 2 and insert the correct Figure 2 as shown on the attached drawing sheet.

On sheet 3 of 3, delete Figure 3 and insert the correct Figure 3 as shown on the attached drawing sheet.

Signed and Sealed this
Third Day of October, 2023

Katherine Kelly Vidal
*Director of the United States Patent and Trademark Office*

(12) United States Patent
Bergman et al.

(10) Patent No.: US 11,673,830 B2
(45) Date of Patent: Jun. 13, 2023

(54) GLASS CARRIER CLEANING USING OZONE

(71) Applicant: APPLIED Materials, Inc., Santa Clara, CA (US)

(72) Inventors: Eric J. Bergman, Kalispell, MT (US); David P. Surdock, Kalispell, MT (US); Graeme Bell, Bigfork, MT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 157 days.

(21) Appl. No.: 17/095,417

(22) Filed: Nov. 11, 2020

(65) Prior Publication Data
US 2022/0144699 A1    May 12, 2022

(51) Int. Cl.
*C03C 23/00* (2006.01)
*H01L 21/673* (2006.01)

(52) U.S. Cl.
CPC ........ *C03C 23/0075* (2013.01); *H01L 21/673* (2013.01)

(58) Field of Classification Search
None
See application file for complete search history.

(56) References Cited

U.S. PATENT DOCUMENTS

| | | |
|---|---|---|
| 2001/0042555 A1 | 11/2001 | Bergman et al. |
| 2002/0050279 A1 | 5/2002 | Bergman |
| 2003/0205254 A1* | 11/2003 | Bergman ......... H01L 21/02052 257/E21.228 |
| 2007/0227556 A1 | 10/2007 | Bergman |
| 2007/0295366 A1 | 12/2007 | Tomita et al. |
| 2012/0160276 A1 | 6/2012 | Okorn-Schmidt et al. |
| 2015/0306847 A1 | 10/2015 | Bellman et al. |
| 2017/0036419 A1* | 2/2017 | Adib .................... B32B 37/26 |
| 2017/0271307 A1* | 9/2017 | Hiner ..................... H01L 24/97 |
| 2018/0269077 A1* | 9/2018 | Zhang ................ H01L 21/6715 |
| 2019/0096708 A1 | 3/2019 | Sharma |

FOREIGN PATENT DOCUMENTS

| | | |
|---|---|---|
| JP | 2000126703 A | 5/2000 |
| JP | 2002151453 A | 5/2002 |

OTHER PUBLICATIONS

PCT, International Search Report and Written Opinion dated Jan. 7, 2022 for International Application No. PCT/US2021/051138, 11 pages.

* cited by examiner

*Primary Examiner* — Natasha N Campbell
*Assistant Examiner* — Pradhuman Parihar
(74) *Attorney, Agent, or Firm* — Perkins Coie LLP

(57) ABSTRACT

In a method for removing an organic adhesive from a glass carrier in a semiconductor manufacturing process, the glass carrier is placed into a process chamber. The glass carrier is rotated and heated sulfuric acid is applied or sprayed onto the glass carrier. Ozone is introduced into the process chamber. The ozone diffuses through the sulfuric acid to the organic adhesive on the surface of the glass carrier. The sulfuric acid and the ozone chemically react with the organic adhesive and remove it from the glass carrier.

11 Claims, 3 Drawing Sheets